United States Patent [19]

Ikeda

[11] Patent Number: 5,273,936
[45] Date of Patent: Dec. 28, 1993

[54] PROCESS FOR FORMING CONTACTS

[75] Inventor: Yujiro Ikeda, Ikoma, Japan

[73] Assignee: Sharp Kabushiki Kaisha, Osaka, Japan

[21] Appl. No.: 936,268

[22] Filed: Aug. 27, 1992

[30] Foreign Application Priority Data

Sep. 2, 1991 [JP] Japan .................. 3-221353

[51] Int. Cl.5 .......................... H01L 21/44
[52] U.S. Cl. .................. 437/180; 437/44; 437/186; 437/187; 437/238
[58] Field of Search .......... 437/180, 186, 187, 235, 437/238, 44, 45, 203, 204

[56] References Cited

U.S. PATENT DOCUMENTS

| | | | |
|---|---|---|---|
| 4,641,420 | 2/1987 | Lee | 437/180 |
| 4,732,761 | 3/1988 | Machida et al. | 437/238 |
| 4,849,369 | 7/1989 | Jeuch et al. | 437/44 |
| 4,956,312 | 9/1990 | Van Laarhoven | 437/180 |
| 5,001,077 | 3/1991 | Sakai | 437/44 |
| 5,124,014 | 6/1992 | Foo et al. | 437/238 |

FOREIGN PATENT DOCUMENTS 2-216851 8/1990 Japan .

Primary Examiner—Brian E. Hearn
Assistant Examiner—Kevin M. Picardat
Attorney, Agent, or Firm—Nixon & Vanderhye

[57] ABSTRACT

A process for forming a contact which comprises (i) forming on a semiconductor substrate a LOCOS oxide film and a conductive pattern thereon, respectively, (ii) forming a first dielectric film and a second dielectric film on a semiconductor substrate including the LOCOS oxide film and the conductive pattern, respectively, and applying a heat treatment to the substrate, (iii) depositing a SiO film while the second dielectric film in a slant or tapered form formed over the edge portion of the conductive pattern is etched, wherein the deposition and etching is conducted by using Bias ECR method, thereby providing uniform thickness of each of the first and second dielectric films and the SiO film at a predetermined contact forming part, and (iv) forming a contact at the predetermined contact forming part.

7 Claims, 2 Drawing Sheets

PROCESS FOR FORMING CONTACTS

BACKGROUND OF THE INVENTION

1. Field of the Invention

The invention relates to a process for forming a contact, and more particularly to a process for forming a contact in producing a MOS transistor such as DRAM, SRAM and Mask ROM and in producing bipolar devices and CCDS.

2. Description of the Related Art

In recent years, LSI devices have been further subminiaturized, as by contacts for N+ (or P+) diffused regions being reduced in thickness to 0.1–0.15 μm. The thickness of interlayer films to be formed for such contacts largely varies depending on specific underlying patterns. Hence, in an etching process for the contact holes, the amount of Si erosion (which tends to occur at the N+ or P+ regions) is controlled by use of a contact mask corresponding to the depth of contacts.

FIG. 2 shows a conventional manufacturing method of a semiconductor device.

A LOCOS oxide film 11 is first provided on a substrate 10 of Si, on which are formed an electrode or a wiring layer 12 of polycide or the like and a spacer 13 adjoining thereto (FIG. 2(a)). A NSG film 14 of 1000–2000 Å is deposited on the substrate 10, polycide 12 and spacer 13, followed by annealing (FIG. 2(b)).

A BPSG film 15 of 4000–6000 Å is also deposited on the NSG film 14 (FIG. 2(c)).

A BPSG film 15 is flowed at 800°–950° C. over NSG film 14 to build a flat surface on the device (FIG. 2(d)).

The flattening process by the BPSG flow does not provide a relevant difference of thickness of the films at the contact forming part at which difference of the film thickness is actually over 5000 Å at the opening portion h due to dispersion in density of BPSG previously deposited. This leads to such a problem that Si erosion is not controlled but occurs at the N+ and P+ regions upon dry etching process of the opening portion h in the sequential procedures.

SUMMARY OF THE INVENTION

The present invention provides a process for forming a contact wherein Si erosion is controlled in the contact forming process to effectively provide a desired contact.

According to the present invention, there is provided a process for forming a contact which comprises:

(i) forming on a semiconductor substrate a LOCOS oxide film and a conductive pattern thereon, respectively, (ii) forming a first dielectric film and a second dielectric film on a semiconductor substrate including the LOCOS oxide film and the conductive pattern, respectively, and applying a heat treatment to the substrate, (iii) depositing a SiO film while the second dielectric film in a slant or tapered form formed over the edge portion of the conductive pattern is etched, wherein the deposition and etching is conducted by using Bias ECR method, thereby providing uniform thickness of each of the first and second dielectric films and the SiO film at a predetermined contact forming part, and (iv) forming a contact at the predetermined contact forming part.

DETAILED DESCRIPTION OF THE PREFERRED EMBODIMENT

The semiconductor substrate to be used in the present invention is not limited to particular materials but may be those for forming semiconductor devices, such as RAM, ROM or mask ROM, bipolar devices and CCD, or preferably a silicon substrate. A device isolation region is provided on the substrate by a LOCOS method to ensure an active region. Also, a conductive pattern to be formed on the substrate may use aluminum, tungsten, polysilicon, silicide or polycide but is not limited to any particular one. Any of the materials is evaporated in desired thickness on the substrate by a customary method and patterned, for example, by photolithographic process to provide the conductive pattern.

The first dielectric film to be deposited on the semiconductor substrate may use NSG, $Si_3N_4$ or the like film, preferably NSG film. The NSG film can be formed by CVD process using gases of $SiH_4$ and $O_2$ family in the ratio of, e.g., 1:10 to 1:20 at about 370° to about 430° C. Thickness of the first dielectric film is preferably in the range of, e.g., 1000–2000 Å. The second dielectric film to be formed on the first dielectric film may use BPSG, PSG, AsSG or the like film, preferably BPSG film. The BPSG film can be formed by CVD process using gases of $SiH_4$, $PH_3$ and $B_2H_6$ in the ratio of, e.g., 50–100: 10–15: 6–7 at about 370°– about 430° C. Thickness of the second dielectric film is preferably in the range of, e.g., 4000–6000 Å. A sequential heat treatment is preferably carried out in the atmosphere of nitrogen gas at about 700° to about 750° C. for about 30 to about 120 min.

According to the present invention, deposition of SiO film on the second dielectric film and etching of the second dielectric film in its slant or tapered form over the edge portion of the conductive pattern are simultaneously conducted by using Bias ECR (Electron Cyclotron Resonance) method, in order to provide uniform thickness of each of the first and second dielectric films and the SiO film at a predetermined contact forming part. Typically, such Bias ECR method uses gases of $SiH_4$, $O_2$ and Ar family in the ratio of, e.g., 30–40:1-50–200:60–80 at about 300 to about 400° C. with applying bias voltage of about 1–1.5 kW to the substrate in order to form the SiO film. Thickness of the SiO film is preferably in the range of 5000–7000 Å. Through this method, the etching will be effected by, e.g., excited argon ion and SiO is deposited by the reaction of $SiH_4$ and $O_2$.

After the above three films are formed as abovesaid, a contact hole can be formed by a customary method, such as photolithographic process and a desired wiring material is deposited and patterned to complete a semiconductor device.

Next, the process for forming a contact according to the present invention will be detailed with referring to FIG. 1.

Figure 1A:
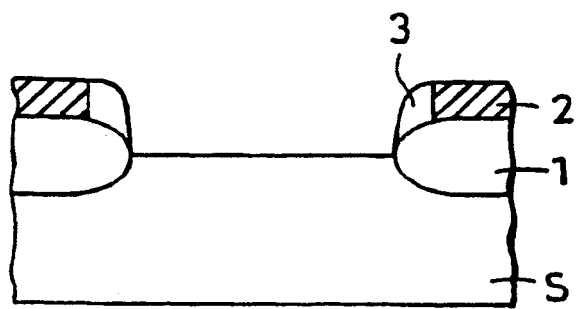
FIGS. 1(a)–(d) are schematic diagrams for clarifying the contact forming process according to the present invention.

A LOCOS oxide film 1 is first formed on the Si substrate, on which polycide 2 is deposited, followed by forming a spacer 3 on the LOCOS oxide film 1 and sidewall the polycide 2 (FIG. 1(a)).

Figure 1B:
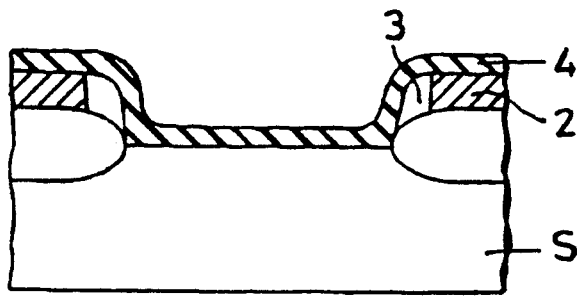

A CVD method is carried out using gases of SiH$_4$, PH$_3$, B$_2$H$_6$ family at 400° C. to deposit NSG film 4 of 1500 Å on the Si substrate S, which is then annealed (FIG. 1(b)).

Figure 1C:
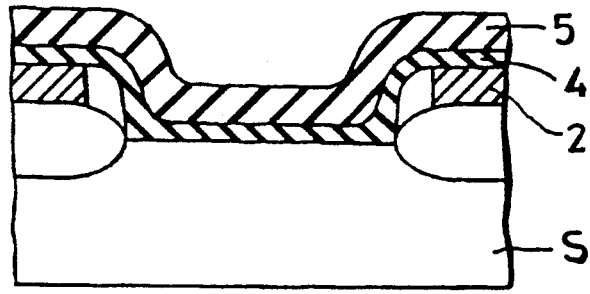
Figure 1D:
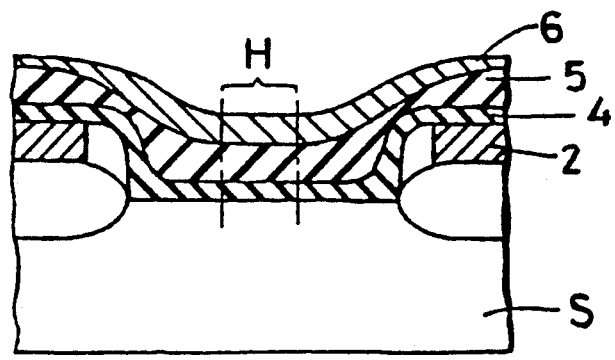
Figure 2A:
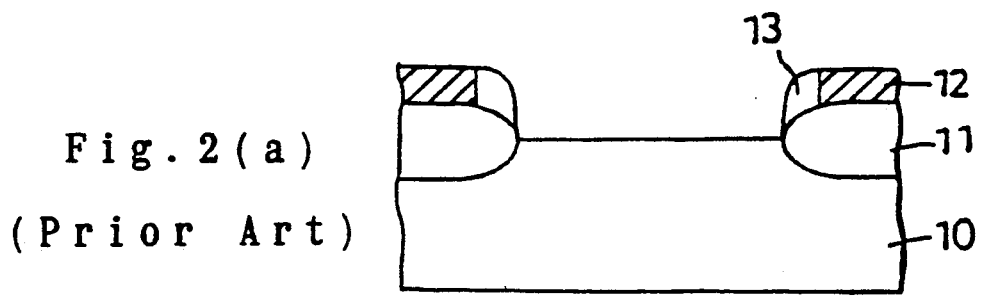
FIGS. 2(a)–(d) are schematic diagrams for clarifying a conventional contact forming process.
Figure 2B:
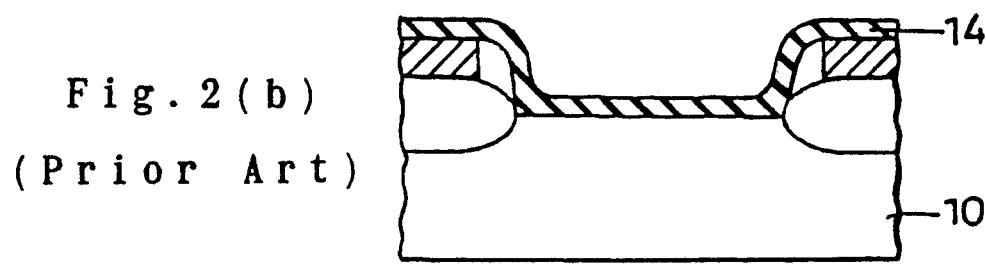
Figure 2C:
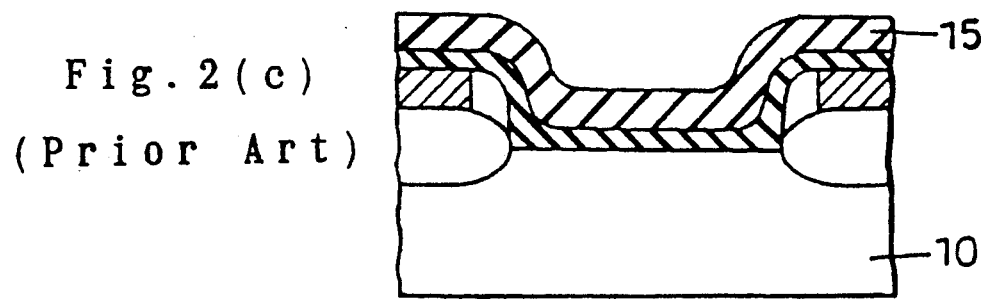
Figure 2D:
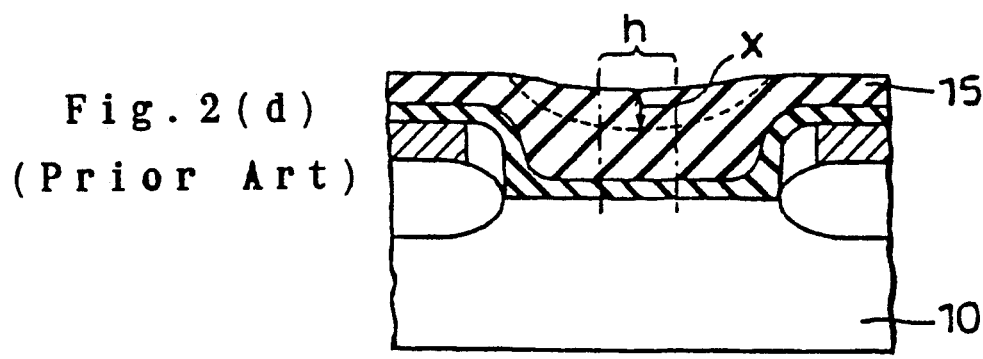

A BPSG film 5 of 5000 Å is deposited on the substrate S by CVD process in the same manner as of the preceding process (FIG. 1(c)).

The BPSG film 5 on the substrate is subjected to low temperature annealing using N$_2$ at 700° C., followed by depositing SiO 6 of 6000 Å by Bias ECR method (Bias Electron Cyclotron Resonance) for flattening the interlayer film. In detail, the Bias ECR method applies a slight bias voltage, e.g., 1 kw to the substrate portion to cause the overhanging part of the surface of BPSG film 5 to be etched while depositing SiO 6 so that the interlayer film may be flattened. Hence, each of three layers of the interlayer film at the contact forming part H has uniform thickness and can be controlled in depth during etching process. The Bias ECR method is carried out using SiH$_4$, O$_2$ and Ar in the ratio of 35:150:60 at 350° C. (FIG. 1(d)).

The Si substrate is then opened at a predetermined part through photolithographic process to form a contact portion, followed by a metal forming process (not shown).

In the above example, the overhanging part of the previously deposited BPSG film 5 is etched by the characteristic Bias ECR method while SiO 6 is deposited, thereby providing the flattening effect with uniform steps of deposits to achieve less difference of thickness of specific layers of the interlayer dielectric film. The resultant interlayer dielectric film can be controlled in the etching rate and amount, so that Si erosion may be controlled to obtain a preferably contact portion.

Hence, the present invention provides a desired contact by a simple operation without necessity of complicated control processes for selected depths of the contacts.

What we claim is:

1. A process for forming a contact which comprises:
   (i) forming on a semiconductor substrate a LOCOS oxide film and a conductive pattern thereon, respectively,
   (ii) forming a first dielectric film and a second dielectric film doped with impurities on the semiconductor substrate including the LOCOS oxide film and the conductive pattern, respectively, and applying a heat treatment at a temperature which does not flow the second dielectric film,
   (iii) depositing a SiO film while the second dielectric film in a slant or tapered form formed over the edge portion of the conductive pattern is etched, wherein the deposition and etching is conducted by using Bias ECR method, thereby providing uniform thickness of each of the first and second dielectric films and the SiO film at a predetermined contact forming part, and
   (iv) forming a contact at the predetermined contact forming part.

2. A process for forming a contact as set forth in claim 1, wherein the first dielectric film is NSG or Si$_3$N$_4$ film.

3. A process for forming a contact as set forth in claim 1, wherein thickness of the first dielectric film is about 1000–2000 Å.

4. A process for forming a contact as set forth in claim 1, wherein the second dielectric film is BPSG, PSG or AsSG film.

5. A process for forming a contact as set forth in claim 1, wherein the heat treatment is carried out in the atmosphere of nitrogen gas at about 700°–750° C.

6. A process for forming a contact as set forth in claim 1, wherein the deposition of SiO film and etching in the step (iii) is conducted by Bias ECR method uses gases of SiH$_4$, O$_2$ and Ar family in the ratio of about 30–40:150–200:60–80 at about 300 to about 400° C.

7. A process for forming a contact as set forth in claim 1, wherein the semiconductor substrate is applied with a bias voltage about 1–1.5 kW for forming a SiO film.

* * * * *